(12) United States Patent
Watarai

(10) Patent No.: US 7,741,875 B2
(45) Date of Patent: Jun. 22, 2010

(54) LOW AMPLITUDE DIFFERENTIAL OUTPUT CIRCUIT AND SERIAL TRANSMISSION INTERFACE USING THE SAME

(75) Inventor: Seiichi Watarai, Kanagawa (JP)

(73) Assignee: NEC Electronics Corporation, Kanagawa, Kawasaki (JP)

( * ) Notice: Subject to any disclaimer, the term of this patent is extended or adjusted under 35 U.S.C. 154(b) by 1110 days.

(21) Appl. No.: 11/362,862

(22) Filed: Feb. 28, 2006

(65) Prior Publication Data

US 2006/0214717 A1 Sep. 28, 2006

(30) Foreign Application Priority Data

Mar. 1, 2005 (JP) ............... 2005-056675

(51) Int. Cl.
*H03K 19/094* (2006.01)
*H03K 19/0175* (2006.01)

(52) U.S. Cl. ............... 326/86; 326/90; 326/115

(58) Field of Classification Search .......... 326/86, 326/90

See application file for complete search history.

(56) References Cited

U.S. PATENT DOCUMENTS

| | | | | |
|---|---|---|---|---|
| 5,959,492 A | * | 9/1999 | Khoury et al. | ............... 327/389 |
| 6,172,542 B1 | * | 1/2001 | Williams et al. | ............ 327/239 |
| 6,803,820 B1 | * | 10/2004 | Muljono | ................ 330/258 |
| 7,245,156 B2 | * | 7/2007 | Yeung et al. | ................ 326/86 |
| 2002/0060588 A1 | | 5/2002 | Taylor | |
| 2004/0051573 A1 | | 3/2004 | Schrodinger | |

FOREIGN PATENT DOCUMENTS

| | | |
|---|---|---|
| EP | 1 274 171 A1 | 1/2003 |
| JP | 7-273619 | 10/1995 |

OTHER PUBLICATIONS

Extended European Search Report dated Jun. 10, 2008.

* cited by examiner

*Primary Examiner*—Anh Q Tran
(74) *Attorney, Agent, or Firm*—McGinn IP Law Group, PLLC

(57) ABSTRACT

A low amplitude differential output circuit includes a pre-buffer circuit configured to output a main buffer drive signal of a-first drive signal and a second drive signal which are complimentary signals, as a differential signal; and a main buffer circuit connected with the pre-buffer circuit to output a differential output signal in response to the main buffer drive signal. Each of the first drive signal and the second drive signal has an amplitude between a first voltage and a second voltage, and the first drive signal and the second drive signal take a same voltage between the first voltage and a middle voltage between the first voltage and the second voltage.

19 Claims, 14 Drawing Sheets

Fig. 2 PRIOR ART
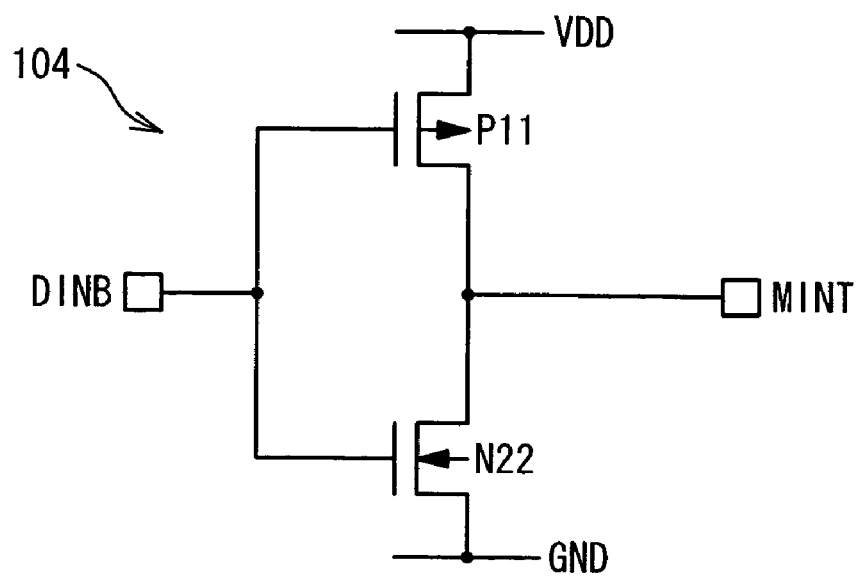
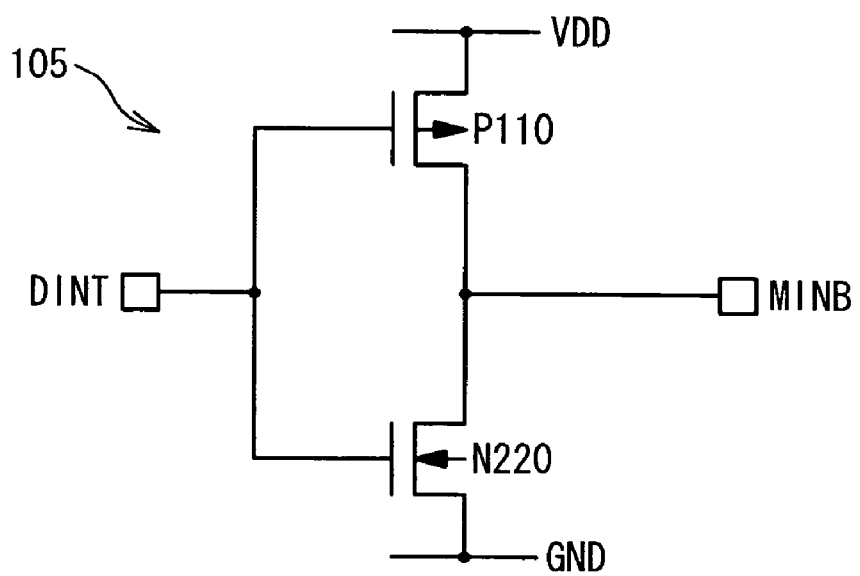

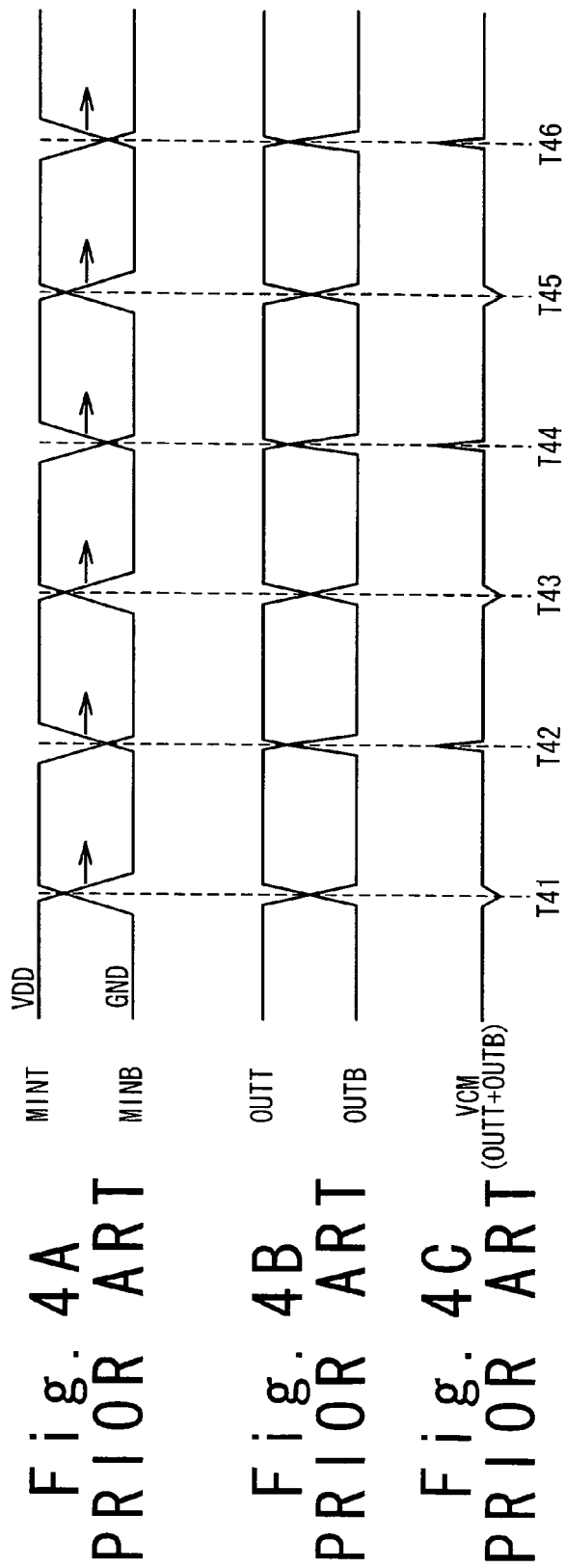

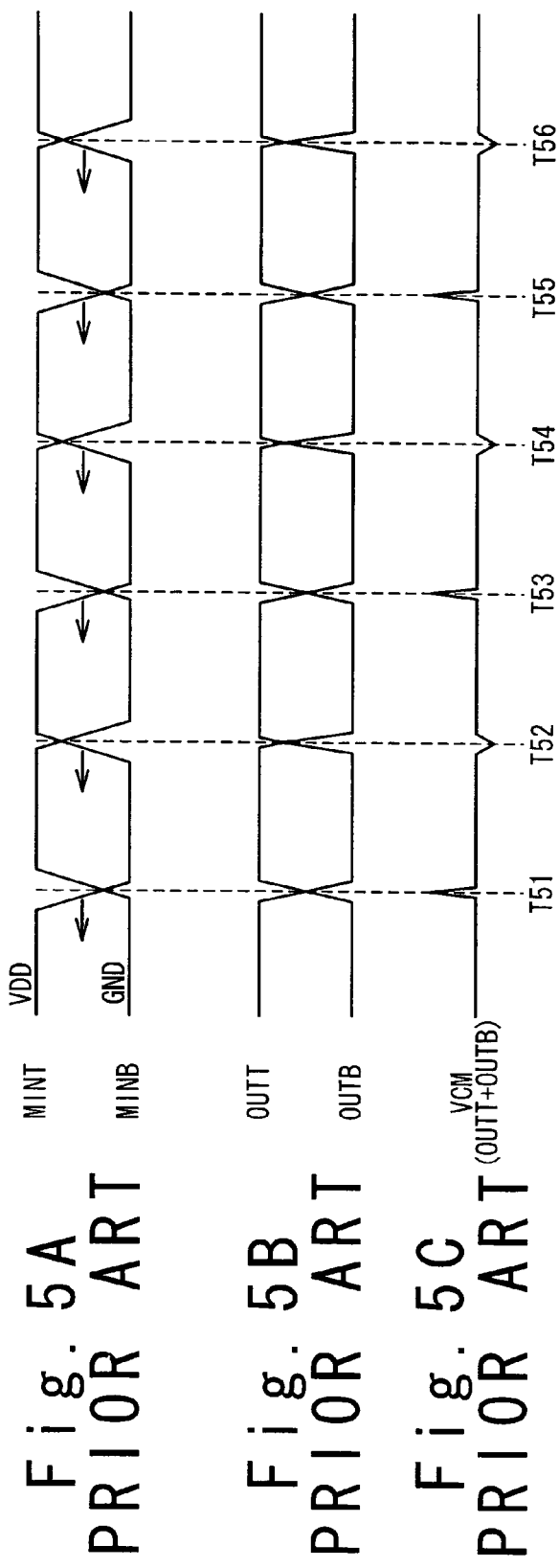

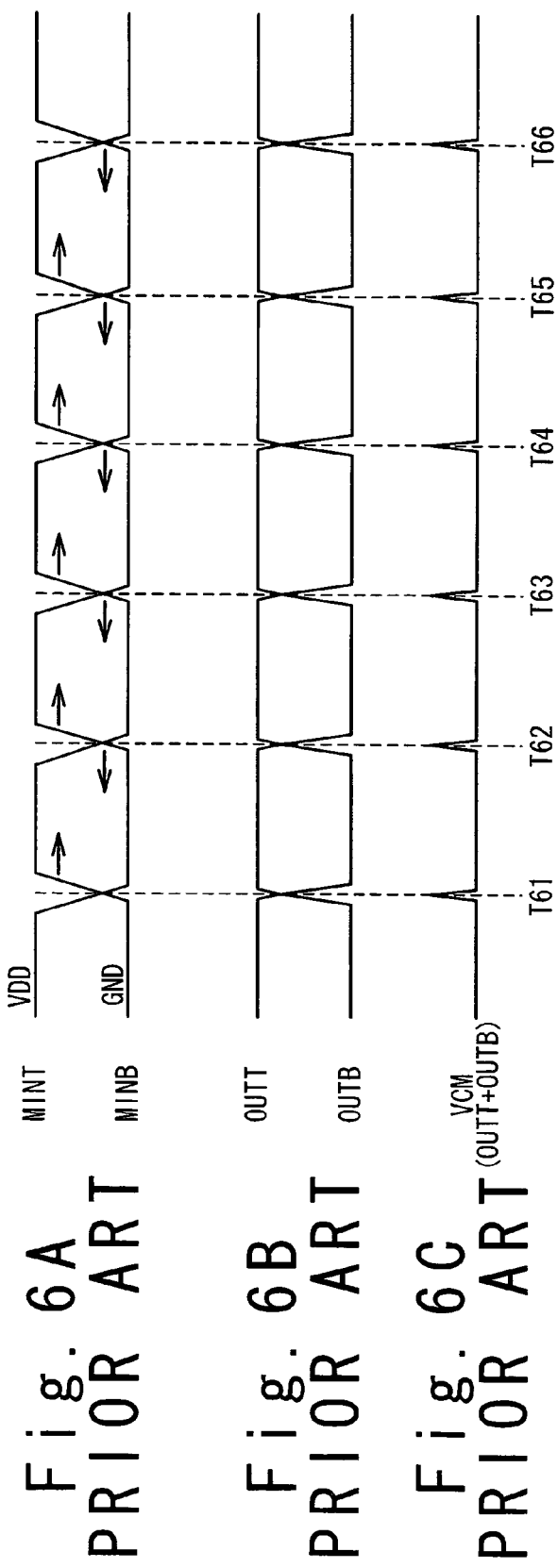

US 7,741,875 B2

LOW AMPLITUDE DIFFERENTIAL OUTPUT CIRCUIT AND SERIAL TRANSMISSION INTERFACE USING THE SAME

BACKGROUND OF THE INVENTION

1. Field of the Invention

The present invention relates to a low amplitude differential output circuit, and more particularly relates to a low amplitude differential output circuit and a serial transmission interface using the same.

2. Description of the Related Art

In recent years, in a field such as the clustering in a server and the connection of the server to an external storage, requiring communication at a super high speed, a serial interface technique represented by InfiniBand (registered trademark) has been widely used. In many cases, a differential output circuit is used for transmission of a signal through a transmission path between integrated circuits or between apparatuses at a high speed.

When the differential output circuit is used, a technique is demanded in which a central voltage of a differential signal to be transmitted, a so-called VCM (Common Mode Voltage) is reduced, in order to suppress EMI (Electric Magnetic Interference) and crosstalk between the transmission paths adjacent to each other. The value of the VCM is defined, for example, in PCI Express (registered trademark) and the InfiniBand (registered trademark), which are the typical examples of the differential interface. Also, in the differential output circuit, great importance is in the fact that an electric power is low and a circuit size is small, in order to suppress power consumption and a chip cost.

One example of the differential output circuit according to the conventional technique will be described below with reference to FIGS. 1 and 2. FIG. 1 is a diagram showing a configuration of the conventional differential output circuit, and FIG. 2 is a diagram showing the configuration of a pre-buffer output circuit.

With reference to FIG. 1, the conventional differential output circuit includes a pre-buffer 100 for outputting a main buffer drive signal MINT/MINB, which is a differential signal for driving a main buffer 200, from an input single phase signal IN; and the main buffer 200 which is connected to the pre-buffer 100 and outputs a differential output signal of signals OUTT/OUTB corresponding to the signal levels of the main buffer drive signal MINT/MINB. The pre-buffer 100 includes CMOS circuits 101 and 102 for generating the differential input signal DINT/DINB from the input single phase signal IN; and a pre-buffer output circuit 103 for outputting the main buffer drive signal MINT/MINB for driving the main buffer 200 having a large transistor size. The pre-buffer output circuit 103 includes a CMOS circuit 105 to which a positive phase input signal DINT of the differential input signal DINT/DINB is supplied; and a CMOS circuit 104 to which a negative phase input signal DINB is supplied.

Referring to FIG. 2, the CMOS circuit 104 has a P-channel MOS transistor P11 and an N-channel MOS transistor N22 between a power source voltage VDD and a ground voltage GND and outputs the positive phase drive signal MINT that is an inversion of the negative phase input signal DINB. The CMOS circuit 105 has a P-channel MOS transistor P110 and an N-channel MOS transistor N220 between the power source voltage VDD and the ground voltage GND and outputs the negative phase drive signal MINB that is an inversion of the positive phase input signal DINT. In this way, the pre-buffer 100 outputs to the main buffer 200 a main buffer drive signal MINT/MINB composed of the positive phase drive signal MINT and the negative phase drive signal MINB which are logically opposite to each other.

Referring to FIG. 1 again, the main buffer 200 includes an N-channel MOS transistor N30 to which the positive phase drive signal MINT outputted from the pre-buffer 100 is supplied; and an N-channel MOS transistor N40 to which the negative phase drive signal MINB is supplied. The N-channel MOS transistor N30 and the N-channel MOS transistor N40 are connected through resistors R30 and R40 to the power source voltage VDD, respectively, and connected through a current source N50 to the ground voltage GND. Here, the power source voltage VDD of the main buffer 200 may be different from the power source voltage VDD of the pre-buffer 100. In such a configuration, in the main buffer 200, the ON/OFF states of the N-channel MOS transistor N40 and the N-channel MOS transistor N30 are controlled in accordance with the signal levels of the main buffer drive signal MINT/MINB. The differential output signal OUTT/OUTB composed of the positive phase output signal OUTT and the negative phase output signal OUTB which are outputted from the respective drains of the transistors N40 and 30 are outputted.

As shown in FIG. 2, in the pre-buffer output circuit 103 that uses the CMOS circuits, the variation in Tpd (a delay time between pins) in the differential input signal DINT/DINB and the main buffer drive signal MINT/MINB causes a problem that the VCM of the differential output signal OUTT/OUTB from the main buffer 200 is extremely varied. Also, in the pre-buffer output circuit 103, the CMOS circuit 104 and the CMOS circuit 105, which are independent of each other, output the positive phase drive signal MINT and the negative phase drive signal MINB, respectively. As a result, a skew in the main buffer drive signal MINT/MINB and the like is changed due to the variation in the power source voltage, the temperature, the process and the like, and a cross point between the positive phase drive signal MINT and the negative phase drive signal MINB is changed. Therefore, the stable VCM level cannot be obtained. Moreover, when a full swing signal to the power source voltage VDD of the CMOS circuit is sent to this differential output circuit, it is difficult to adjust the cross point of the positive phase drive signal MINT and the negative phase drive signal MINB to the operation point of the differential output circuit.

FIGS. 3A to 3C, 4A to 4C, 5A to 5C and 6A to 6C show the signal waveforms of the differential output signals OUTT/OUTB and VCM (OUTT+OUTB) when the main buffer drive signal MINT/MINB whose peak voltages are from the VDD to the GND is supplied to the main buffer 200 in the differential output circuit shown in FIG. 1.

With reference to FIGS. 3A to 3C, when the cross point of the main buffer drive signal MINT/MINB is set to a standard value of VDD/2 at times T31, T32, T33, T34 and so on, the cross points (the times T31, T32, T33, T34 and so on) of the differential output signal OUTT/OUTB is always on the high voltage side. When the differential output signal OUTT/OUTB is shifted, the VCM is varied to an undesirable value (exceeding an allowable range defined by a rule or the like).

FIGS. 4A to 4C shows the waveforms of the main buffer drive signal MINT/MINB, the differential output signal OUTT/OUTB and the VCM, when the positive phase drive signal MINT of the pre-buffer output circuit 103 is delayed rather than the negative phase drive signal MINB. In this case, the falling time from a high level to a low level in the positive phase drive signal MINT or the rising time from the low level to the high level is always delayed than the rising time from the low level to the high level in the negative phase drive signal MINB or the falling time from the high level to the low level. Thus, the cross point of the main buffer drive signal MINT/MINB is on a high voltage side (VDD side) at times T41, T43, T45 and so on, and the cross point is on a low voltage side (GND side) at times T42, T44, T46 and so on. Thus, the cross points of the differential output signal OUTT/OUTB are alternately varied between the high voltage side (the times T42, T44 and so on) and the middle point (the times T41, T43 and so on) between the high level and the low level. When the cross points of the differential output signal OUTT OUTB are located near the middle point (the times T41, T43 and so on), the VCM is varied at the value within a ruled allowable range. However, when the cross points of the differential output signal OUTT/OUTB are on the high voltage side (the times T42, T44 and so on), the VCM is varied in an undesirable range.

FIGS. 5A to 5C shows the time charts of the main buffer drive signal MINT/MINB, the differential output signal OUTT/OUTB and the VCM when the positive phase drive signal MINT of the pre-buffer output circuit 103 is advanced from the negative phase drive signal MINB. In this case, the falling time from the high level to the low level in the positive phase drive signal MINT or the rising time from the low level to the high level is always advanced from the rising time from the low level to the high level in the negative phase drive signal MINB or the falling time from the high level to the low level. Thus, the cross points of the main buffer drive signal MINT/MINB are on the low voltage side (the GND side) at times T51, T53 and so on and on the high voltage side (the VDD side) at times T52, T54 and so on. Therefore, the cross points of the differential output signal OUTT/OUTB are alternately varied between the high voltage side (the times T51, T53, T55 and so on) and the middle point (T52, T54, T56 and so on) between the high level and the low level. When the cross points of the differential output signal OUTT/OUTB are located near the middle points (the times T52, T54, T56 and so on), the VCM is varied in the ruled allowable range. However, when the cross points of the differential output signal OUTT/OUTB are on the high voltage side (the times T51, T53, T55 and so on), the VCM is varied in an undesirable range.

FIGS. 6A to 6C show the waveforms of the main buffer drive signal MINT/MINB, the differential output signal OUTT/OUTB and the VCM, when the duty of the positive phase drive signal MINT in the pre-buffer output circuit 103 is shifted to the negative phase drive signal MINB. In this case, in the main buffer drive signal MINT/MINB, the rising time from the low level to the high level is always delayed than the falling time from the high level to the low level. Thus, the cross points of the main buffer drive signal MINT/MINB are always on the low voltage side (GND side) at times T61, T62, T63, T64 and so on. Therefore, at the times T61, T62, T63, T64 and so on, the cross points of the differential output signal OUTT/OUTB are always on the high voltage side. At this time, the VCM is varied to the worst value, as compared with the variations in the VCM shown in FIGS. 3A to 3C, 4A to 4C and 5A to 5C.

FIG. 7 shows one example of a configuration of another conventional differential output circuit using a differential CML circuit. The differential output circuit includes a pre-buffer 110 for generating the main buffer drive signal MINT/MINB which is a differential signal to drive a main buffer 210, from an input single phase signal IN; and the main buffer 210 which is connected to the pre-buffer 110 and outputs the differential output signal OUTT/OUTB corresponding to the signal levels of the main buffer drive signal MINT/MINB. The pre-buffer 110 includes a CMOS circuit 111 and a converter 112 which generates a differential input signal DINT/DINB from the single phase signal IN; and a differential CML 113 for outputting the main buffer drive signal MINT/MINB to drive the main buffer 210 whose transistor size is large. The converter 112 decreases a full swing level of VDD to about ½ of the power supply voltage VDD for the CMOS circuit 111, and outputs the main buffer drive signal MINT/MINB. In such a configuration, the pre-buffer 110 outputs the main buffer drive signal MINT/MINB, which is composed of the positive phase drive signal MINT and the negative phase drive signal MINB that are opposite in phase to each other, to the main buffer 210. The main buffer 210 has the same structure as the above main buffer 200 and includes an N-channel MOS transistor N41 to which the positive phase drive signal MINT outputted from the pre-buffer 110 is supplied; and an N-channel MOS transistor N31 to which the negative phase drive signal MINB is supplied. The N-channel MOS transistor N31 and the N-channel MOS transistor N41 are connected to the power source voltage VDD through resistors R31 and R41, respectively, and connected through a current source N51 to the ground voltage GND. In such a configuration, in the main buffer 210, ON and OFF of the N-channel MOS transistor N31 and the N-channel MOS transistor N41 are controlled in accordance with the signal levels of the main buffer drive signal MINT/MINB, and the differential output signal OUTT/OUTB composed of the positive phase output signal OUTT and the negative phase output signal OUTB is outputted from the respective drains of the transistors.

With reference to FIGS. 8A to 8C, typically, the CML circuit uses a stable constant current. Thus, even if the variation in the power source voltage, the temperature, the process or the like is caused, the cross points of the main buffer drive signal MINT/MINB outputted from the CML circuit can be adjusted to the vicinity of the operation point of the main buffer 210. At times T81, T82, T83, T84 and so on, the cross points of the differential output signal OUTT/OUTB are always located near the middle point between the high level and the low level. At this time, a relatively small variation is attained in the VCM.

In conjunction with the above description, Japanese Laid Open Patent Application (JP-A-Heisei, 7-273619) discloses a conventional buffer circuit that can prevent the generation of skew and reduce a timing margin. In this conventional buffer circuit, between an output of a CMOS inverter constituting an input gate stage and an input of the CMOS inverter serving as the same phase output gate stage, a push-pull circuit is provided to output a signal having the same phase as the output signal of the CMOS inverter in parallel to the CMOS inverter as a signal route, and the numbers of the gate stages to the same phase output and the negative phase output are made equal. As a result, the delay time between the same phase output and the negative phase output is removed, thereby preventing the generation of the skew.

In the differential output circuit using the CMOS circuit, when the cross points of the main buffer drive signal MINT/MINB are on the high voltage side, the cross points of the differential output signal OUTT/OUTB are located near the middle point between the high level and the low level, and the VCM variation generated at this time is within the allowable range defined by the rule. However, in the differential output circuit shown in FIG. 2, it is difficult to consider the variations in the power source voltage, the temperature, the process and the like, maintain the cross points of the main buffer drive signal MINT/MINB on the high voltage side, and reduce the VCM variation. For example, in case of the differential output circuit used in a SerDes circuit, the inventor of the present invention confirmed the fact that, although VCM=25 mV (rms) is defined in PCI Express and InfiniBand, the maximum value of the VCM variation is 51 mV actually.

Also, in case of the differential output circuit using the CLM circuit, electric power consumption and circuit size in the pre-buffer 110 become greater. It causes increase in price containing a package that this circuit is installed in a macro such as a high speed serial interface macro occupying the majority of a chip and having a large electric consumption power. Therefore, the differential output circuit using this kind of CML circuit is not practicable. For example, when this differential output circuit is used in the high speed serial interface macro, the VCM variation is 10 mV (rms) although the definition is 25 mV (rms). This indicates the variation within the allowable range. In this case, however, the inventor of the present invention confirmed that the electric power consumption is about four times as compared with the conventional example using the CMOS circuit, and the macro area is about ten times.

SUMMARY OF THE INVENTION

In an aspect of the present invention, a low amplitude differential output circuit includes a pre-buffer circuit configured to output a main buffer drive signal of a first drive signal and a second drive signal which are complimentary signals, as a differential signal; and a main buffer circuit connected with the pre-buffer circuit to output a differential output signal in response to the main buffer drive signal. Each of the first drive signal and the second drive signal has an amplitude between a first voltage and a second voltage, and the first drive signal and the second drive signal take a same voltage between the first voltage and a middle voltage between the first voltage and the second voltage.

Here, the pre-buffer circuit may include a first CMOS circuit configured to output a first input signal of a positive phase in response to an external input signal; a second CMOS circuit configured to output a second input signal obtained by inverting the first input signal from the first CMOS circuit; and a pre-buffer output circuit connected with the first and second CMOS circuits and configured to output the main buffer drive signal to the main buffer circuit in response to the first input signal and the second input signal.

Also, the pre-buffer output circuit may include a first CMOS inverter having a first MOS transistor and a second MOS transistor between the first voltage and the second voltage; and a second CMOS inverter having a third MOS transistor and a fourth MOS transistor between the first voltage and the second voltage. The first CMOS inverter includes a fifth MOS transistor between the first MOS transistor and the second MOS transistor, and the second CMOS inverter comprises a sixth MOS transistor between the third MOS transistor of and the fourth MOS transistor. A first output terminal as a node between the first MOS transistor of and the fifth MOS transistor is connected with a gate of the sixth MOS transistor, and a second output terminal as a node between the third MOS transistor and the sixth MOS transistor is connected with a gate of the fifth MOS transistor. The first CMOS inverter outputs the second drive signal from the first output terminal in response to the first input signal, and the second CMOS inverter outputs the first drive signal from the second output terminal in response to the second input signal.

In this case, the first and third MOS transistors may be P-channel MOS transistors, and the second, fourth, fifth, sixth, seventh, and eighth MOS transistors may be N-channel transistors. Otherwise, the second, fourth, fifth, sixth, seventh and eighth MOS transistors may be P-channel MOS transistors, and the first and third MOS transistors may be N-channel transistors.

Also, the main buffer circuit may include a differential transistor pair of seventh and eighth MOS transistor between the first voltage and the second voltage. The second output terminal is connected with a gate of the seventh MOS transistor, and the first output terminal is connected with a gate of the eighth MOS transistor. The first output signal is outputted from a drain of the seventh MOS transistor, and the second output signal is outputted from a drain of the eighth MOS transistor.

Also, the main buffer drive signal may be outputted such that one of the first and second drive signals is raised and then the other is fallen. Alternately, the main buffer drive signal may be outputted such that one of the first and second drive signals is fallen and then the other is raised.

AA serial transmission interface includes the above low amplitude differential output circuit connected with a first integrated circuit; and a transmission path connected with the low amplitude differential output circuit and a second integrated circuit. The low amplitude differential output circuit outputs a signal from the first integrated circuit to the second integrated circuit through the transmission path.

In another aspect of the present invention, a method of controlling VCM (Common Mode Voltage) in a low amplitude differential output circuit is achieved by generating a first input signal of a positive phase in response to an external input signal; by generating a second input signal obtained by inverting the first input signal; by generating a main buffer drive signal of first and second drive signals, which are complimentary, from the first and second input signal; and by generating a differential output signal in response to the main buffer drive signal. Each of the first drive signal and the second drive signal has an amplitude between a first voltage and a second voltage, and the first drive signal and the second drive signal take a same voltage between the first voltage and a middle voltage between the first voltage and the second voltage.

Also, the generating a main buffer drive signal may be achieved by generating the second drive signal from a first output terminal in response to the first input signal; and by generating the first drive signal from a second output terminal in response to the second input signal.

Also, the generating a main buffer drive signal may be achieved by generating the main buffer drive signal such that one of the first and second drive signals is raised and then the other is fallen.

Also, the generating a main buffer drive signal may be achieved by generating the main buffer drive signal such that one of the first and second drive signals is fallen and then the other is raised.

In another aspect of the present invention, a low amplitude differential output circuit includes a pre-buffer circuit configured to output a main buffer drive signal of a first drive signal and a second drive signal which are complimentary signals, as a differential signal; and a main buffer circuit connected with the pre-buffer circuit to output a differential output signal in response to the main buffer drive signal. Each of the first drive signal and the second drive signal has an amplitude between a first voltage and a second voltage, and the main buffer drive signal is outputted such that one of the first and second drive signals is raised and then the other is fallen.

Also, the pre-buffer circuit may include a first CMOS circuit configured to output a first input signal of a positive phase in response to an external input signal; a second CMOS circuit configured to output a second input signal obtained by inverting the first input signal from the first CMOS circuit; and a pre-buffer output circuit connected with the first and second CMOS circuits and configured to output the main buffer drive signal to the main buffer circuit in response to the first input signal and the second input signal.

Also, the pre-buffer output circuit may include a first CMOS inverter having a first MOS transistor and a second MOS transistor between the first voltage and the second voltage; and a second CMOS inverter having a third MOS transistor and a fourth MOS transistor between the first voltage and the second voltage. The first CMOS inverter may include a fifth MOS transistor between the first MOS transistor and the second MOS transistor, and the second CMOS inverter may include a sixth MOS transistor between the third MOS transistor of and the fourth MOS transistor. A first output terminal as a node between the first MOS transistor of and the fifth MOS transistor may be connected with a gate of the sixth MOS transistor, and a second output terminal as a node between the third MOS transistor and the sixth MOS transistor may be connected with a gate of the fifth MOS transistor. The first CMOS inverter outputs the second drive signal from the first output terminal in response to the first input signal, and the second CMOS inverter outputs the first drive signal from the second output terminal in response to the second input signal.

Here, the first and third MOS transistors may be P-channel MOS transistors, and the second, fourth, fifth, sixth, seventh, and eighth MOS transistors may be N-channel transistors.

Alternately, the second, fourth, fifth, sixth, seventh and eighth MOS transistors may be P-channel MOS transistors, and the first and third MOS transistors may be N-channel transistors.

Also, the main buffer circuit may include a differential transistor pair of seventh and eighth MOS transistor between the first voltage and the second voltage. The second output terminal is connected with a gate of the seventh MOS transistor, and the first output terminal is connected with a gate of the eighth MOS transistor. The first output signal is outputted from a drain of the seventh MOS transistor, and the second output signal is outputted from a drain of the eighth MOS transistor.

In still another aspect of the present invention, a low amplitude differential output circuit includes a pre-buffer circuit configured to output a main buffer drive signal of a first drive signal and a second drive signal which are complimentary signals, as a differential signal; and a main buffer circuit connected with the pre-buffer circuit to output a differential output signal in response to the main buffer drive signal. Each of the first drive signal and the second drive signal has an amplitude between a first voltage and a second voltage, and the main buffer drive signal is outputted such that one of the first and second drive signals is fallen and then the other is raised.

BRIEF DESCRIPTION OF THE DRAWINGS

FIG. 2 is a diagram showing the configuration of a pre-buffer output circuit;

FIGS. 4A to 4C are time charts of another kind of signal waves of MINT/MINB, OUTT/OUTB and VCM in the conventional low amplitude differential output circuit;

FIGS. 5A to 5C are time charts of another kind of signal waves of MINT/MINB, OUTT/OUTB and VCM in the conventional low amplitude differential output circuit;

FIGS. 6A to 6C are time charts of another kind of signal waves of MINT/MINB, OUTT/OUTB and VCM in the conventional low amplitude differential output circuit;

DESCRIPTION OF THE PREFERRED EMBODIMENTS

Hereinafter, a low amplitude differential output circuit and a serial interface circuit using the same of the present invention will be described in detail with reference to the attached drawings. The serial interface circuit serially transmits a signal on a transmission path between integrated circuits.

First Embodiment

Figure 1:
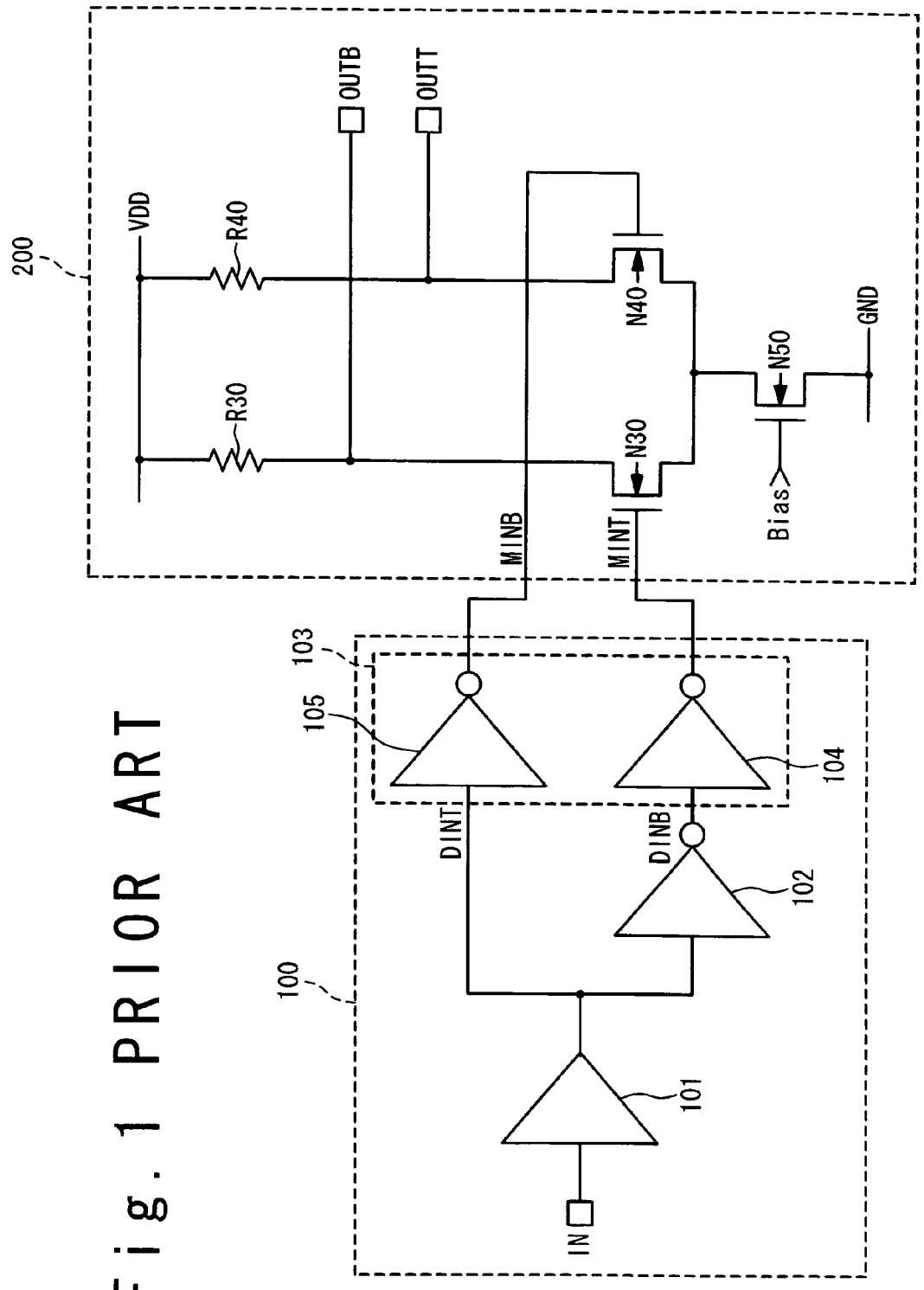
FIG. 1 is a diagram showing a configuration of a conventional differential output circuit.
Figures 3A, 3B, 3C:
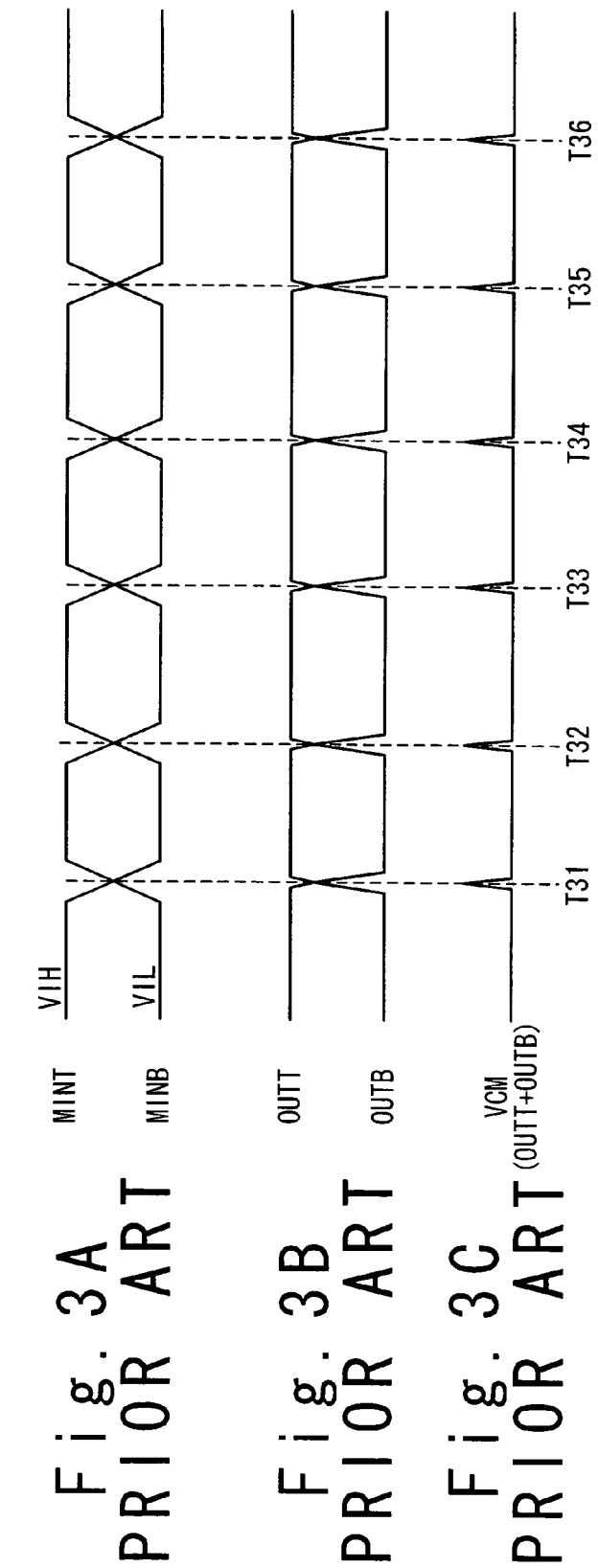
FIGS. 3A to 3C are time charts of a kind of signal waves of MINT/MINB, OUTT/OUTB and VCM in the conventional low amplitude differential output circuit.
Figure 7:
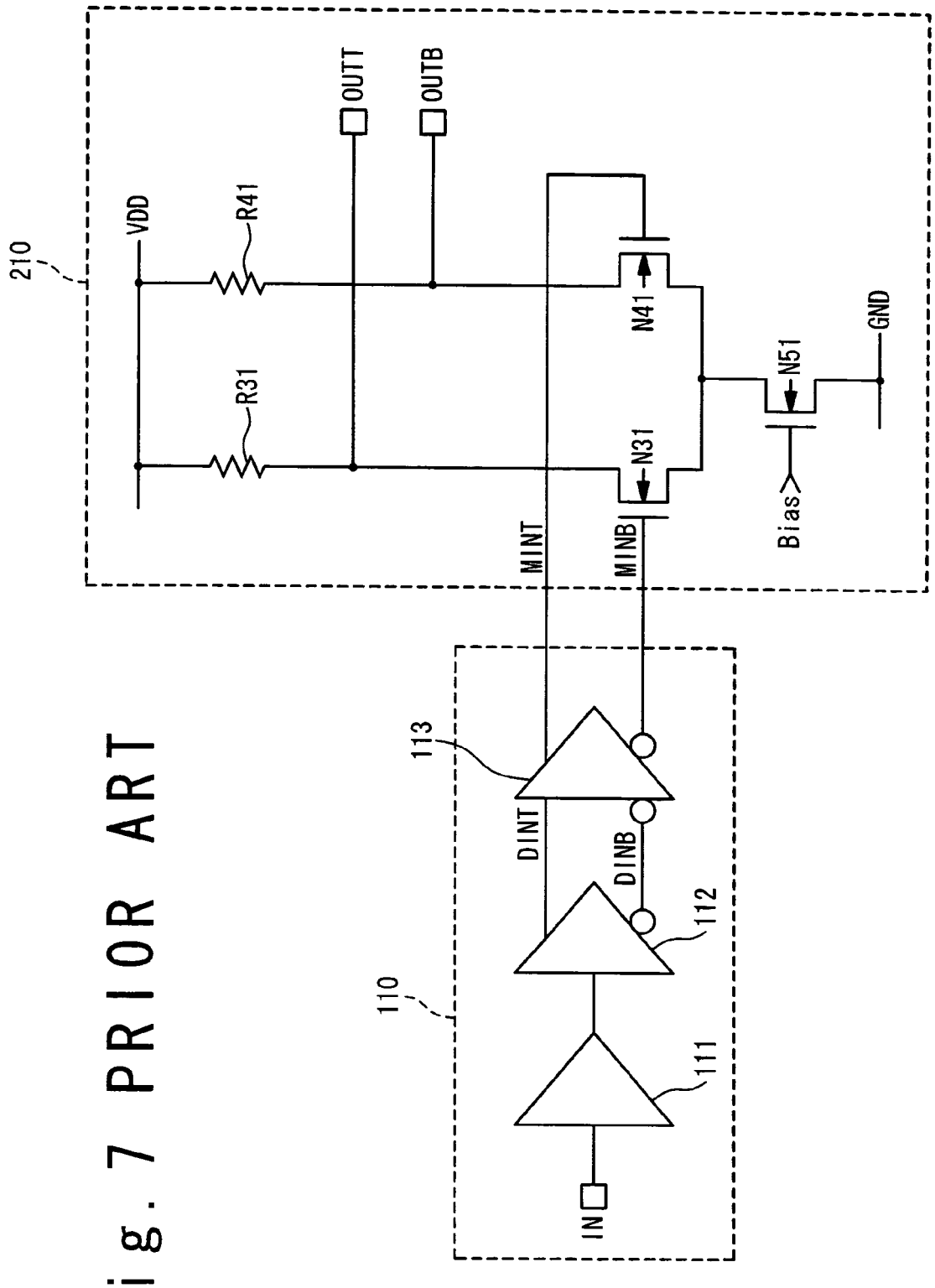
FIG. 7 is a configuration of another conventional low amplitude differential output circuit.
Figure 8:
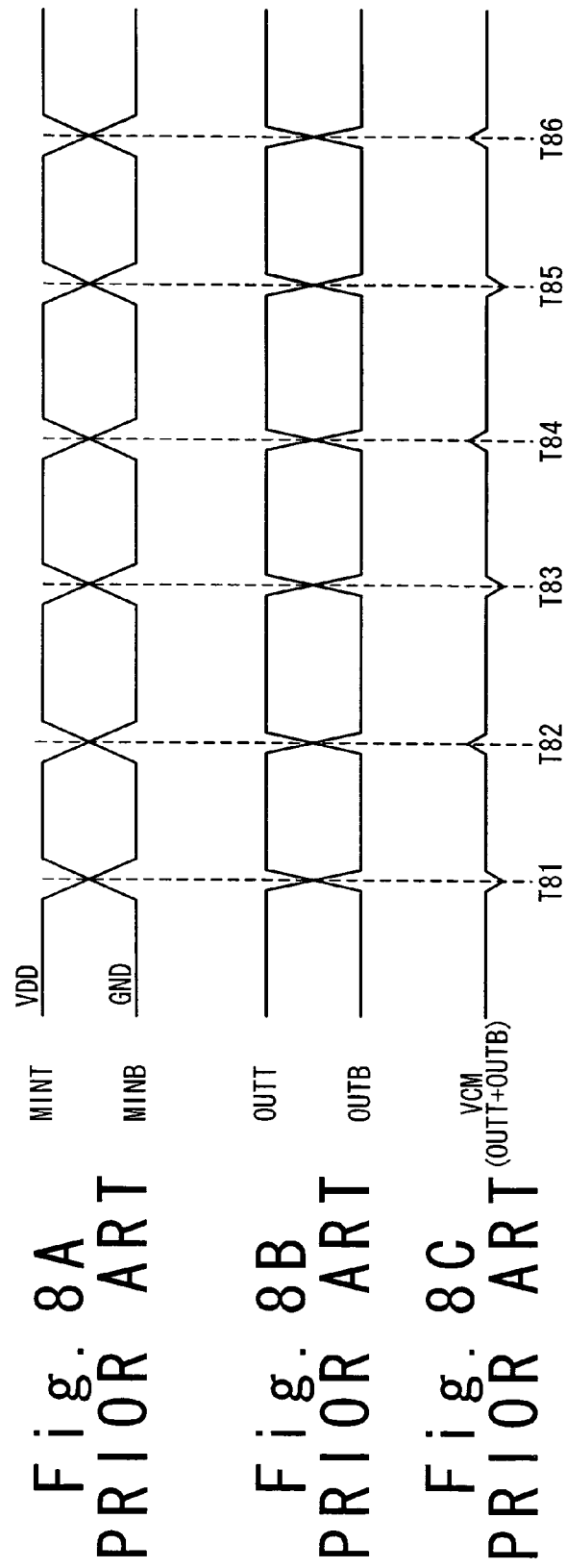
FIGS. 8A to 8C are time charts of another kind of signal waves of MINT/MINB, OUTT/OUTB and VCM in the conventional low amplitude differential output circuit.
Figure 9:
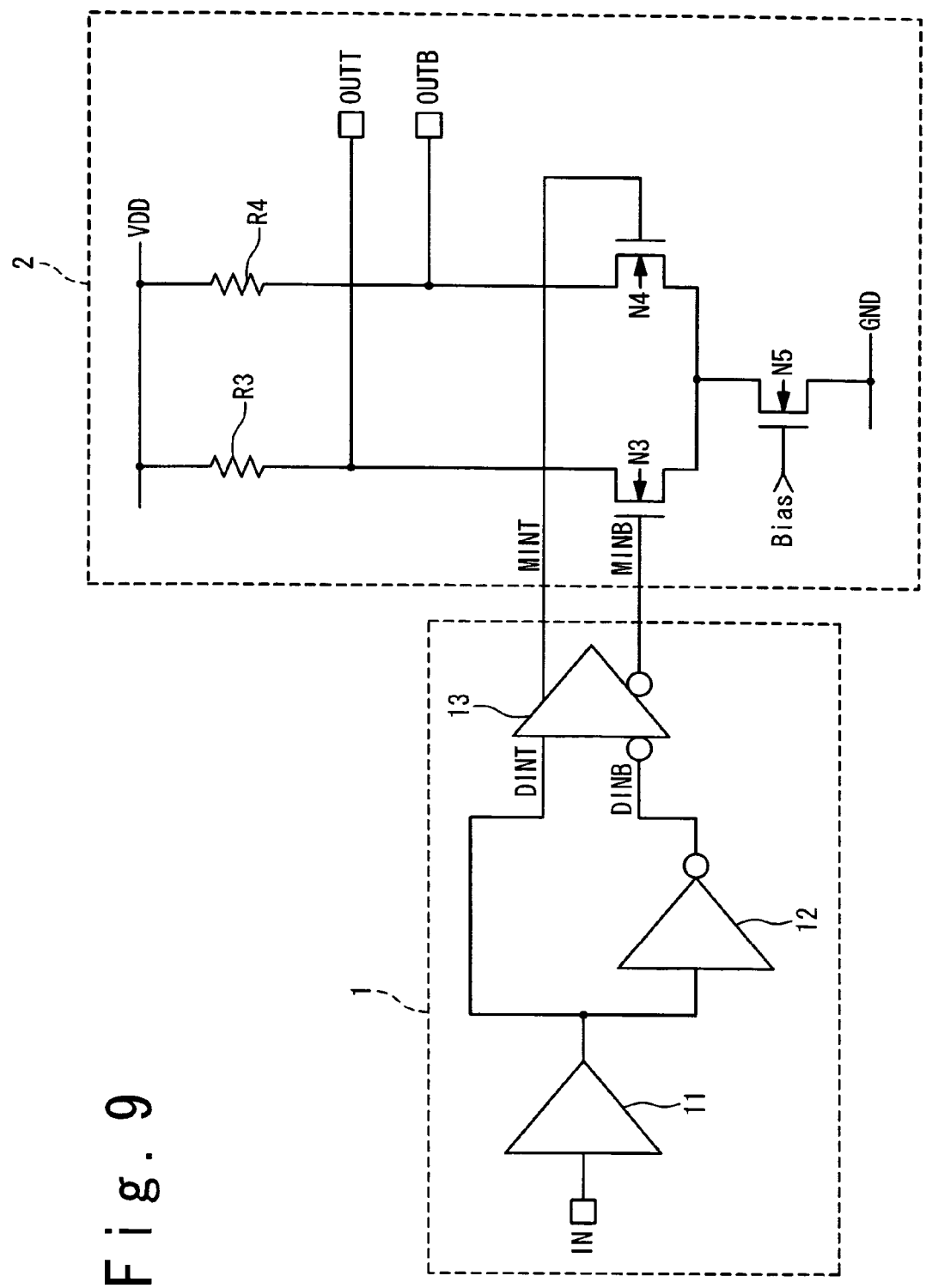
FIG. 9 is a diagram showing a configuration of a low amplitude differential output circuit according to a first embodiment of the present invention.

FIG. 9 is a diagram showing a configuration of the low amplitude differential output circuit according to the first embodiment of the present invention. Referring to FIG. 9, the low amplitude differential output circuit in the first embodiment includes a pre-buffer 1 and a main buffer 2. The pre-buffer 1 outputs a main buffer drive signal MINT/MINB as a differential signal from a single phase signal IN to drive the main buffer 2. The main buffer 2 is connected to the pre-buffer 1 and outputs a differential output signal OUTT/OUTB corresponding to the signal levels of the main buffer drive signal MINT/MINB.

Figure 10:
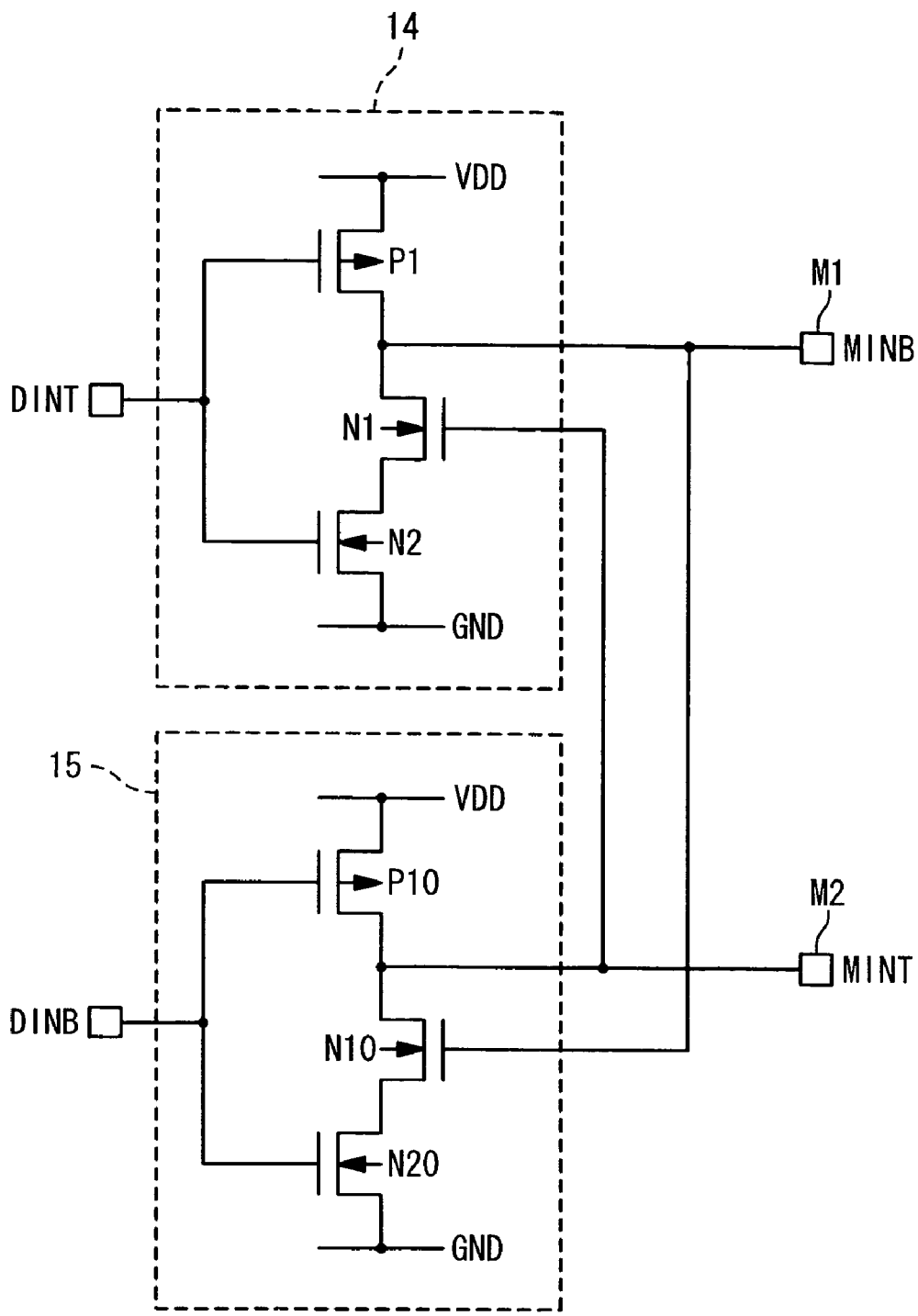
FIG. 10 is a diagram showing a configuration of a pre-buffer output circuit according to the first embodiment the present invention.

The pre-buffer 1 includes CMOS circuits 11 and 12 for generating the differential input signal DINT/DINB from the single phase signal IN; and a pre-buffer output circuit 13 for outputting the main buffer drive signal MINT/MINB for driving the main buffer 200 having a large transistor size. With reference to FIG. 10, the pre-buffer output circuit 13 includes a CMOS circuit 14 and a CMOS circuit 15. The CMOS circuit 14 receives the positive phase input signal DINT of the differential input signal DINT/DINB, and the CMOS circuit 15 receives the negative phase input signal DINB thereof. The CMOS circuit 14 has a P-channel MOS transistor P1 and an N-channel MOS transistor N2 between the power source voltage VDD and the ground voltage GND, and outputs a negative phase drive signal MINB as an inversion signal of the input positive phase input signal DINT from an output terminal M1. Also, an N-channel MOS transistor N1 is connected between the output terminal M1 and a drain of the N-channel MOS transistor N2. A gate of the N-channel MOS transistor N1 is connected to an output terminal M2 of the CMOS circuit 15. The CMOS circuit 15 has a P-channel MOS transistor P10 and an N-channel MOS transistor N20 between the power source voltage VDD and the ground voltage GND, and outputs a positive phase drive signal MINT as an inversion signal of the input negative phase input signal DINT, from the output terminal M2. Also, the N-channel MOS transistor N10 is connected between the output terminal M2 and a drain of the N-channel MOS transistor N20. A gate of the N-channel MOS transistor N10 is connected to the output terminal M1 of the CMOS circuit 14. In such a configuration, the pre-buffer 1 outputs to the main buffer 2, the main buffer drive signal MINT/MINB composed of the positive phase drive signal MINT and the negative phase drive signal MINB, which are opposite in phase to each other.

With reference to FIG. 9, the main buffer 2 includes an N-channel MOS transistor N4 and an N-channel MOS transistor N3. The N-channel MOS transistor N4 receives the positive phase drive signal MINT outputted from the pre-buffer 1, and the N-channel MOS transistor N3 receives the negative phase drive signal MINB. The N-channel MOS transistor N3 and the N-channel MOS transistor N4 are connected through resistors R3 and R4 to the power source voltage VDD, respectively, and connected through a current source N5 to the ground voltage GND. Here, the power source voltage VDD may be different from the power source voltage VDD in the pre-buffer 1. In such a configuration, in the main buffer 2, ON and OFF states of the N-channel MOS transistor N3 and the N-channel MOS transistor N4 are controlled in accordance with the signal levels of the main buffer drive signal MINT/MINB, and the differential output signal OUTT/OUTB composed of the positive phase output signal OUTT and the negative phase output signal OUTB are outputted from the respective drains of the transistors.

In this way, the low amplitude differential output circuit according to the first-embodiment of the present invention has the configuration where the CMOS circuits are used. Thus, the lower electric power consumption and the smaller chip area can be attained.

Figure 11:
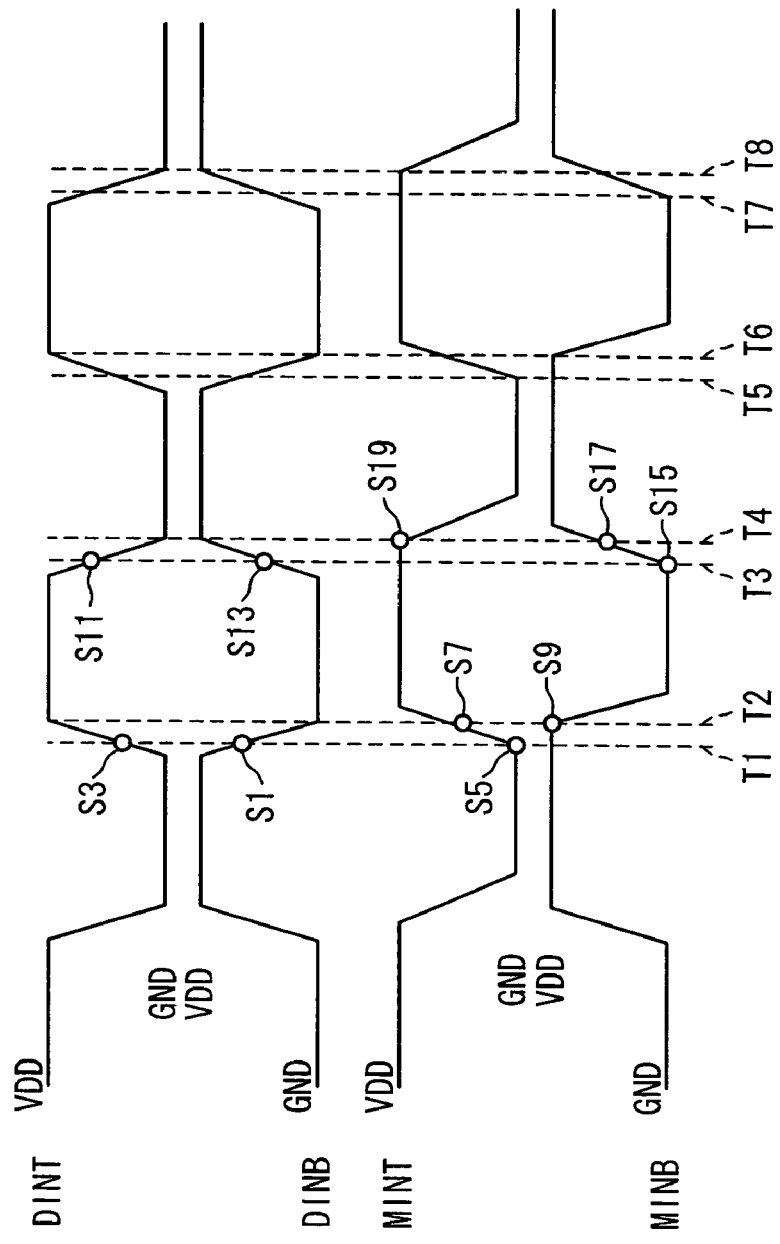
FIGS. 11A and 11B are time charts of signal waves of a differential input signal and a main buffer drive signal in the low amplitude differential output circuit according to the first embodiment of the present invention.
Figure 12:
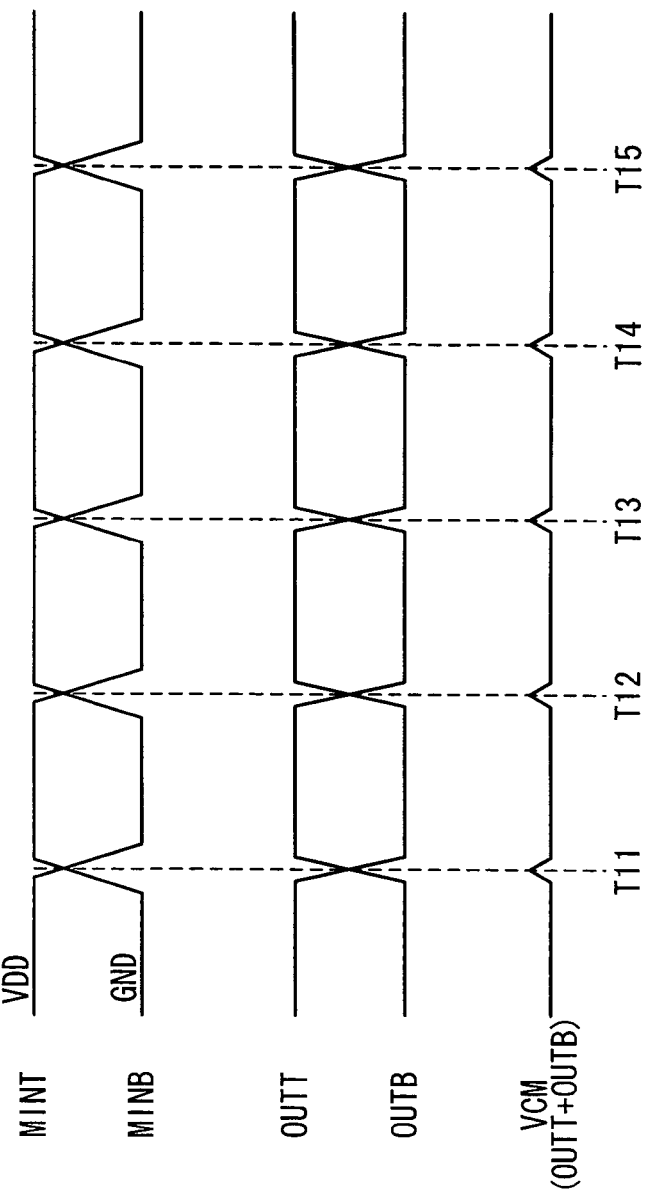
FIGS. 12A to 12C are time charts of another kind of signal waves of MINT/MINB, OUTT/OUTB and VCM in the low amplitude differential output circuit.

Next, an operation of the low amplitude differential output circuit according to the first embodiment of the present invention will be described below with reference to FIGS. 11A and 11B, and 12A to 12C. FIGS. 11A and 11B show the waveforms of the differential input signal DINT/DINB and main buffer drive signal MINT/MINB in the pre-buffer output circuit 13. FIGS. 12A to 12C are time charts of the waveforms of the differential output signal OUTT/OUTB, which is outputted in accordance with the main buffer drive signal MINT/MINB supplied from the pre-buffer output circuit 13 to the main buffer 2, and a time chart of the VCM (OUTT+OUTB).

With reference to FIGS. 11A and 11B, the operation of the pre-buffer output circuit 13 from a time T1 to T4 will be described. At first, at the time T1, when the negative phase input signal DINB supplied to the pre-buffer output circuit 13 becomes a low level, the P-channel MOS transistor P10 is turned ON, and the N-channel MOS transistor N20 is turned OFF (S1). At this time, the voltage level of the positive phase drive signal MINT is increased by the P-channel MOS transistor P10 being turned ON (S5). Also, when the positive phase input signal DINT supplied to the pre-buffer output circuit 13 becomes the high level, the P-channel MOS transistor P1 is turned OFF, and the N-channel MOS transistor N2 is turned ON (S3). At this time, since the positive phase drive signal MINT is in the low level, the N-channel MOS transistor N1 is in the OFF state. Thus, the voltage level of the negative phase drive signal MINB is not changed until the time T2 when the N-channel MOS transistor N1 is turned ON (S9).

At the time T2, the voltage level of the positive phase drive signal MINT is increased to the high level, the N-channel MOS transistor N1 is turned ON (S7), and the voltage of the negative phase drive signal MINB is decreased (S9). In this way, the falling time of the negative phase drive signal MINB is always delayed by a period of T2-T1 from the rising time of the positive phase drive signal MINT.

Next, at the time T3, when the positive phase input signal DINT supplied to the pre-buffer output circuit 13 becomes the low level, the P-channel MOS transistor P1 is turned ON, and the N-channel MOS transistor N2 is turned OFF (S11). At this time, the voltage level of the negative phase drive signal MINB is increased by the P-channel MOS transistor P10 being turned ON (S15). Also, when the negative phase input signal DINB supplied to the pre-buffer output circuit 13 becomes the high level, the P-channel MOS transistor P10 is turned OFF, and the N-channel MOS transistor N20 is turned ON (S13). At this time, since the negative phase drive signal MINB is in the low level, the N-channel MOS transistor N10 is in the OFF state. Thus, the voltage of the positive phase drive signal MINT is not changed until the time T4 when the N-channel MOS transistor N10 is turned ON (S19).

At the time T4, when the voltage level of the negative phase drive signal MINB is increased to the high level, the N-channel MOS transistor N10 is turned ON (S17), and the voltage level of the positive phase drive signal MINT is decreased (S19). In this way, the falling time of the positive phase drive signal MINT is always delayed by a period of T4-T3 from the rising time of the negative phase drive signal MINB. As mentioned above, even after the times T5 to T8, the operation is similar to that at the times T1 to T4.

In this way, the pre-buffer output circuit 13 according to the first embodiment of the present invention outputs the main buffer drive signal MINT/MINB so as to always delay the falling timing of the signal level than the rising timing of the signal level. That is, as shown in FIGS. 12A to 12C, it is always possible to supply to the main buffer 2, the main buffer drive signal MINT/MINB, signals of which always intersect each other on the higher voltage side than the middle voltage between the power source voltage VDD and the ground voltage GND.

With reference to FIGS. 12A to 12C, the main buffer drive signal MINT/MINB supplied to the main buffer 2 according to the first embodiment of the present invention has the cross points on the high voltage side, at the times T11, T12 and so on. Thus, the cross points of the differential output signal OUTT/OUTB are always near the middle points between the high level and the low level, and the VCM variation at the times T11, T12 and so on is suppressed.

In this way, the low amplitude differential output circuit according to the first embodiment of the present invention can suppress the VCM variation without any influence of variation caused by the power source voltage, the temperature and the process even if using the CMOS circuits. Also, the inventor of the present invention produced a trial sample of the low amplitude differential output circuit for the high speed serial interface macro and the VCM variation of 14 mV (rms) could be attained.

Second Embodiment

Figure 13:
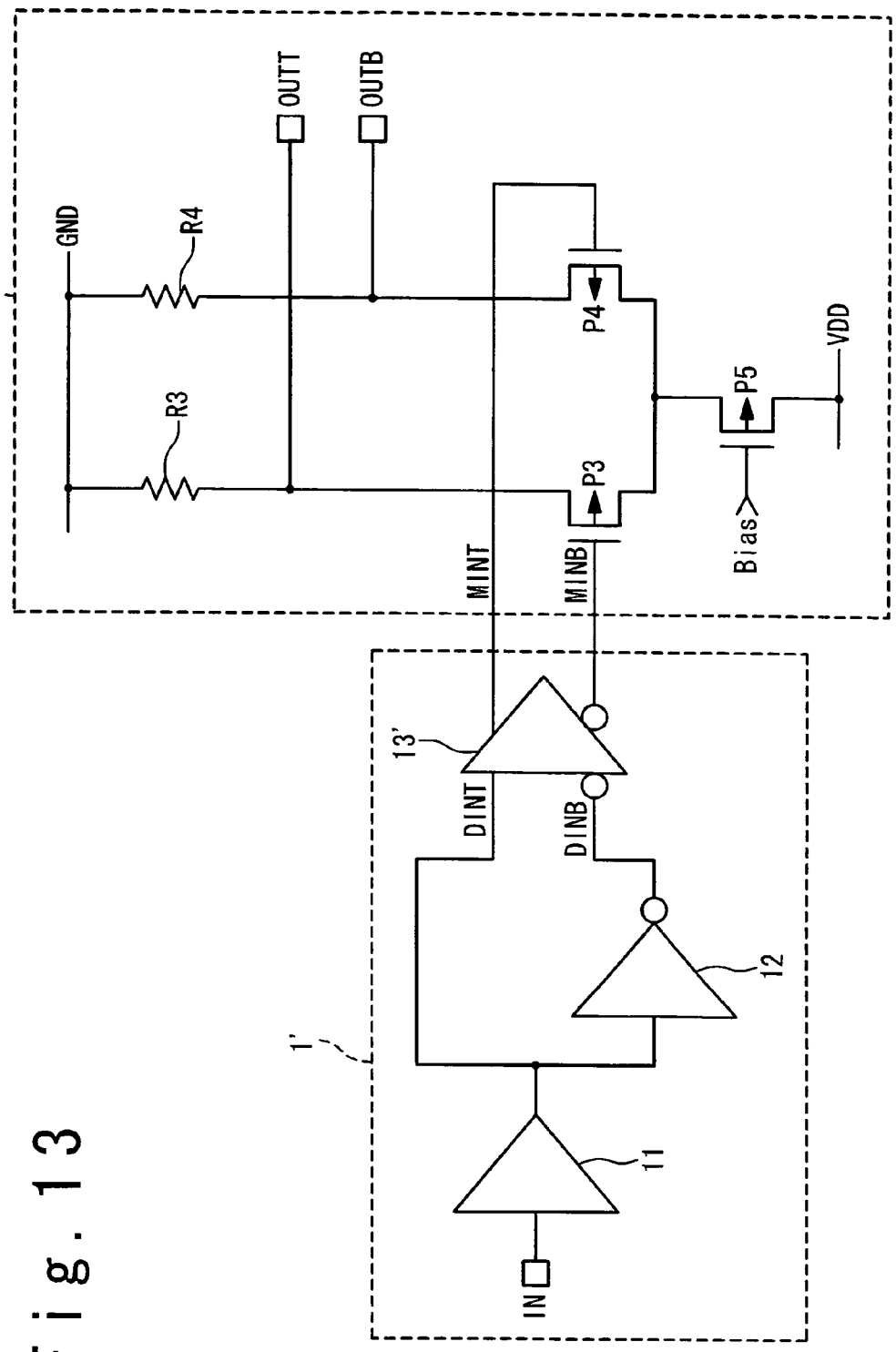
FIG. 13 is a diagram showing a configuration of the low amplitude differential output circuit according to a second embodiment of the present invention.
Figure 14:
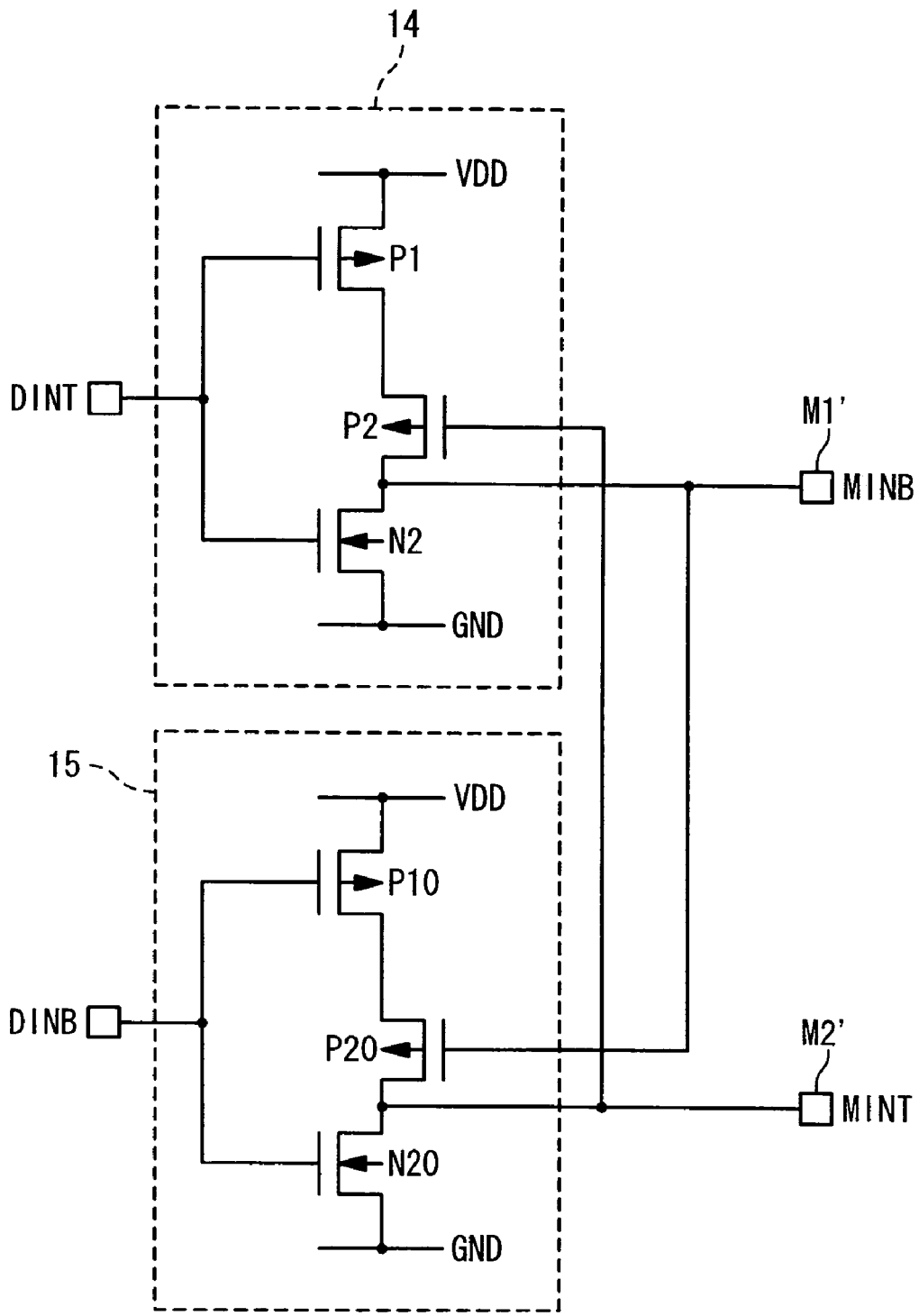
FIG. 14 is a diagram showing a configuration of a pre-buffer output circuit according to the second embodiment the present invention.

The low amplitude differential output circuit according to the second embodiment of the present invention will be described below. With reference to FIG. 13, the configuration of the low amplitude differential output circuit in the second embodiment has a main buffer 2' which uses P-channel MOS transistors P3, P4 and P5 instead of the N-channel MOS transistors N3, N4 and N5 of the main buffer 2 in the first embodiment. In the main buffer 2', the power source voltage VDD and the ground voltage GND are replaced with each other. Also, in a pre-buffer output circuit 13', P-channel MOS transistors P2 and P20 are used instead of the N-channel MOS transistors N1 and N10 of the pre-buffer output circuit 13. At this time, in the pre-buffer output circuit 13', an output terminal M1' to which the negative phase drive signal MINB is outputted is provided between the drain of the N-channel MOS transistor N2 and the drain of the P-channel MOS transistor P2, and an output terminal M2' to which the positive phase drive signal MINT is outputted is provided between the drain of the N-channel MOS transistor N20 and the drain of the P-channel MOS transistor P20. Also, the gate of the P-channel MOS transistor P2 is connected to the output terminal M2', and the gate of the P-channel MOS transistor P20 is connected to the output terminal M1', respectively.

In such a configuration, similarly to the first embodiment, the rising timing of the positive phase drive output signal MINT outputted from the pre-buffer output circuit 13' is delayed than the falling timing of the negative phase drive output signal MINB, and the rising timing of the negative phase drive output signal MINB is delayed than the falling timing of the positive phase drive output signal MINT. Thus, the cross points of the main buffer drive output signal MINT/MINB are always on the low voltage side (GND side), and the cross points of the differential output signals OUTT/OUTB are at the middle point between the high level and the low level, and the variation in the VCM value can be reduced.

As mentioned above, the low amplitude differential output circuit according to the present invention can reduce the influence caused by the variations in the inter-differential-signal skew and duty of the differential signal for driving the main buffer. Also, while using the CMOS circuits, it is possible to output the stable differential output signal OUTT/OUTB which is small in the VCM variation even against the variations in the power source voltage, the temperature and the process.

Also, although the embodiments of the present invention have been described in detail, the present invention is not limited to the above specific configurations of the above-mentioned embodiments. Even if there is any modification without departing from the scope and spirit of the present invention, it is included in the present invention.

In the low amplitude differential output circuit according to the present invention, it is possible to output the differential signal where the VCM variation is small and the amplitude is low.

Also, it is possible to suppress the VCM variation while using the circuit configuration whose circuit area is small.

What is claimed is:

1. A low amplitude differential output circuit comprising:
   a pre-buffer circuit configured to output a main buffer drive signal of a first drive signal and a second drive signal which are complementary signals, as a differential signal; and
   a main buffer circuit connected with said pre-buffer circuit to output a differential output signal in response to said main buffer drive signal,
   wherein each of said first drive signal and said second drive signal has an amplitude between a first voltage and a second voltage,
   said first drive signal and said second drive signal take a same voltage between said first voltage and a middle voltage between said first voltage and said second voltage, and
   said differential output signal includes cross points adjacent to the middle voltage level between a maximum minimum level of the differential output signal.

2. The low amplitude of vibration differential output circuit according to claim 1, wherein said pre-buffer circuit comprises:
   a first CMOS circuit configured to output a first input signal of a positive phase in response to an external input signal;
   a second CMOS circuit configured to output a second input signal obtained by inverting said first input signal from said first CMOS circuit; and
   a pre-buffer output circuit connected with said first and second CMOS circuits and configured to output said main buffer drive signal to said main buffer circuit in response to said first input signal and said second input signal.

3. The low amplitude differential output circuit according to claim 1, wherein said pre-buffer output circuit comprises:
   a first CMOS inverter having a first MOS transistor and a second MOS transistor between said first voltage and said second voltage; and
   a second CMOS inverter having a third MOS transistor and a fourth MOS transistor between said first voltage and said second voltage,
   wherein said first CMOS inverter comprises a fifth MOS transistor between said first MOS transistor and said second MOS transistor,
   said second CMOS inverter comprises a sixth MOS transistor between said third MOS transistor of and said fourth MOS transistor,
   a first output terminal as a node between said first MOS transistor of and said fifth MOS transistor is connected with a gate of said sixth MOS transistor,
   a second output terminal as a node between said third MOS transistor and said sixth MOS transistor is connected with a gate of said fifth MOS transistor,
   said first CMOS inverter outputs said second drive signal from said first output terminal in response to said first input signal, and
   said second CMOS inverter outputs said first drive signal from said second output terminal in response to said second input signal.

4. The low amplitude differential output circuit according to claim 3, wherein said first and third MOS transistors comprise P-channel MOS transistors, and
   said second, fourth, fifth, sixth, MOS transistors are N-channel transistors.

5. The low amplitude differential output circuit according to claim 3, wherein said second, fourth, fifth, sixth, MOS transistors comprise P-channel MOS transistors, and said first and third MOS transistors comprise N-channel transistors.

6. The low amplitude differential output circuit according to claim 3, wherein said main buffer circuit comprises:
a differential transistor pair of seventh and eighth MOS transistor between said first voltage and said second voltage,
said second output terminal is connected with a gate of said seventh MOS transistor,
said first output terminal is connected with a gate of said eighth MOS transistor,
said first output signal is outputted from a drain of said seventh MOS transistor, and
said second output signal is outputted from a drain of said eighth MOS transistor.

7. The low amplitude differential output circuit according to claim 1, wherein said main buffer drive signal is outputted such that one of said first and second drive signals is raised and then the other is fallen.

8. The low amplitude differential output circuit according to claim 1, wherein said main buffer drive signal is outputted such that one of said first and second drive signals is fallen and then the other is raised.

9. The low amplitude differential output circuit according to claim 1, wherein said low amplitude differential output circuit is used for signal transmission between first and second integrated circuits through a transmission path.

10. A low amplitude differential output circuit comprising:
a pre-buffer circuit configured to output a main buffer drive signal of a first drive signal and a second drive signal which are complimentary signals, as a differential signal; and
a main buffer circuit connected with said pre-buffer circuit to output a differential output signal in response to said main buffer drive signal,
wherein each of said first drive signal and said second drive signal has an amplitude between a first voltage and a second voltage,
wherein said main buffer drive signal is outputted such that always one of said first and second drive signals is raised and then the other one of said first and second signals falls in amplitude, and
wherein said pre-buffer output circuit comprises:
a first CMOS inverter having a first MOS transistor and a second MOS transistor between said first voltage and said second voltage; and
a second CMOS inverter having a third MOS transistor and a fourth MOS transistor between said first voltage and said second voltage,
wherein said first CMOS inverter comprises a fifth MOS transistor between said first MOS transistor and said second MOS transistor,
said second CMOS inverter comprises a sixth MOS transistor between said third MOS transistor of and said fourth MOS transistor,
a first output terminal as a node between said first MOS transistor of and said fifth MOS transistor is connected with a gate of said sixth MOS transistor,
a second output terminal as a node between said third MOS transistor of and said sixth MOS transistor is connected with a gate of said fifth MOS transistor,
said first CMOS inverter outputs said second drive signal from said first output terminal in response to said first input signal, and
said second CMOS inverter outputs said first drive signal from said second output terminal in response to said second input signal.

11. The low amplitude differential output circuit according to claim 10, wherein said first and third MOS transistors comprise P-channel MOS transistors, and
said second, fourth, fifth, and sixth MOS transistors are N-channel transistors.

12. The low amplitude differential output circuit according to claim 10, wherein said second, fourth, fifth, sixth MOS transistors comprise P-channel MOS transistors, and
said first and third MOS transistors are N-channel transistors.

13. The low amplitude differential output circuit according to claim 10, wherein said main buffer circuit comprises:
a differential transistor pair of seventh and eighth MOS transistor between said first voltage and said second voltage,
said second output terminal is connected with a gate of said seventh MOS transistor,
said first output terminal is connected with a gate of said eighth MOS transistor,
said first output signal is outputted from a drain of said seventh MOS transistor, and
said second output signal is outputted from a drain of said eighth MOS transistor.

14. A low amplitude differential output circuit comprising:
a pre-buffer circuit configured to output a main buffer drive signal of a first drive signal and a second drive signal which are complimentary signals, as a differential signal; and
a main buffer circuit connected with said pre-buffer circuit to output a differential output signal in response to said main buffer drive signal,
wherein each of said first drive signal and said second drive signal has an amplitude between a first voltage and a second voltage,
wherein said main buffer drive signal is outputted such that one of said first and second drive signals is fallen and then with a predetermined delay the other one of said first and second drive signals is raised, and
wherein said pre-buffer output circuit comprises:
a first CMOS inverter having a first MOS transistor and a second MOS transistor between said first voltage and said second voltage; and
a second CMOS inverter having a third MOS transistor and a fourth MOS transistor between said first voltage and said second voltage,
wherein said first CMOS inverter comprises a fifth MOS transistor between said first MOS transistor and said second MOS transistor,
said second CMOS inverter comprises a sixth MOS transistor between said third MOS transistor of and said fourth MOS transistor,
a first output terminal as a node between said first MOS transistor of and said fifth MOS transistor is connected with a gate of said sixth MOS transistor,
a second output terminal as a node between said third MOS transistor of and said sixth MOS transistor is connected with a gate of said fifth MOS transistor,
said first CMOS inverter outputs said second drive signal from said first output terminal in response to said first input signal, and
said second CMOS inverter outputs said first drive signal from said second output terminal in response to said second input signal.

15. The low amplitude differential output circuit according to claim 14, wherein said first and third MOS transistors comprise P-channel MOS transistors, and said second, fourth, fifth, sixth, MOS transistors comprise N-channel transistors.

16. The low amplitude differential output circuit according to claim 14, wherein said second, fourth, fifth, sixth, MOS transistors comprise P-channel MOS transistors, and
said first and third MOS transistors comprise N-channel transistors.

17. The low amplitude differential output circuit according to claim 1, wherein the one of said first and second drive signals is delayed by a predetermined period from the rising time of the other one of said first and second signals.

18. The low amplitude differential output circuit according to claim 6, wherein said first and third MOS transistors comprise MOS transistors of a first polarity type, and
said second, fourth, fifth, sixth, seventh and eighth MOS transistors comprise transistors of a second polarity type opposite to the first polarity type.

19. A method of a low amplitude differential output circuit, comprising:
receiving an input signal by a first circuit;
converting the input signal to a first drive signal and a second drive signal which are complimentary signals by the first circuit, as a differential signal;
delaying, by a predetermined period, one of the first and second drive signals from a rising time of the other one of the first and second drive signals;
outputting a main buffer drive signal of the first drive signal and the second drive signal from the first circuit, as a differential signal, each of said first drive signal and said second drive signal has an amplitude between a first voltage and a second voltage, and the first drive signal and said second drive signal take a same voltage between said first voltage and a middle voltage between said first voltage and said second voltage; and
outputting a differential output signal in response to the main buffer drive signal by a second circuit connected to the first circuit, said differential output signal including cross points adjacent to the middle voltage between a maximum level and a minimum level of the differential output signal.

* * * * *